(12) United States Patent  (10) Patent No.: US 8,022,555 B2
Hwang et al.  (45) Date of Patent: Sep. 20, 2011

(54) SEMICONDUCTOR PACKAGE AND METHOD OF FORMING THE SAME

(75) Inventors: Tae-Joo Hwang, Anyang-si (KR); Tae-Gyeong Chung, Suwon-si (KR); Eun-Chul Ahn, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 409 days.

(21) Appl. No.: 12/149,741

(22) Filed: May 7, 2008

(65) Prior Publication Data

US 2008/0277800 A1  Nov. 13, 2008

(30) Foreign Application Priority Data

May 8, 2007  (KR) .................. 10-2007-0044643

(51) Int. Cl.
 *H01L 21/00* (2006.01)
(52) U.S. Cl. ......... 257/777; 257/673; 257/773; 438/109
(58) Field of Classification Search .................. 247/673, 247/773, 777; 438/109
 See application file for complete search history.

(56) References Cited

U.S. PATENT DOCUMENTS

| 5,173,766 A | * | 12/1992 | Long et al. | 257/687 |
| 5,648,684 A | * | 7/1997 | Bertin et al. | 257/685 |
| 5,708,567 A | * | 1/1998 | Shim et al. | 361/723 |
| 5,861,666 A | * | 1/1999 | Bellaar | 257/686 |
| 5,977,640 A | * | 11/1999 | Bertin et al. | 257/777 |
| 6,294,406 B1 | * | 9/2001 | Bertin et al. | 438/109 |
| 6,885,106 B1 | * | 4/2005 | Damberg et al. | 257/777 |
| 6,927,484 B2 | * | 8/2005 | Thomas et al. | 257/685 |
| 7,115,972 B2 | * | 10/2006 | Dotta et al. | 257/621 |
| 7,218,006 B2 | * | 5/2007 | Kang et al. | 257/777 |
| 7,298,032 B2 | * | 11/2007 | Kim et al. | 257/686 |
| 2003/0153122 A1 | * | 8/2003 | Brooks | 438/107 |
| 2007/0108583 A1 | * | 5/2007 | Shim et al. | 257/686 |

FOREIGN PATENT DOCUMENTS

| JP | 63-156348 | 6/1988 |
| JP | 2001-102479 | 4/2001 |
| KR | 10-0349283 | 8/2002 |
| KR | 10-2006-0074146 | 7/2006 |
| KR | 10-2006-0074796 | 7/2006 |
| KR | 10-2006-0084120 | 7/2006 |
| KR | 10-2007-0006327 | 1/2007 |

OTHER PUBLICATIONS

English Language Abstract of KR 10-2001-0067231 dated Jul. 21, 2001.

* cited by examiner

*Primary Examiner* — Jarrett J Stark
*Assistant Examiner* — Nicholas Tobergte
(74) *Attorney, Agent, or Firm* — Harness, Dickey & Pierce, P.L.C.

(57) ABSTRACT

Example embodiments relate to semiconductor packages and methods of forming the same. A semiconductor package according to example embodiments may include a printed circuit board (PCB), a first semiconductor chip mounted on the PCB, and a chip package mounted on the first semiconductor chip. The chip package may be in direct contact with the first semiconductor chip.

19 Claims, 7 Drawing Sheets

SEMICONDUCTOR PACKAGE AND METHOD OF FORMING THE SAME

PRIORITY STATEMENT

This application claims priority under 35 U.S.C. §119 to Korean Patent Application No. 10-2007-0044643, filed on May 8, 2007 in the Korean Patent Office (KIPO), the entire contents of which are incorporated herein by reference.

BACKGROUND

1. Technical Field

Example embodiments relate to semiconductor devices and methods of forming the same.

2. Description of the Related Art

The packaging of integrated circuits in the semiconductor field is constantly in development as a result of the demand for miniaturization. For example, mounting a plurality of semiconductor chips in a single package so as to achieve a multi-chip package is currently being researched. Among the multi-chip packages, a system-in-package (SIP) has been gaining attention, wherein a SIP is configured to realize a system by sealing a plurality of semiconductor chips, each of the semiconductor chips having a different function in the single package.

To attain a relatively high-speed operation for the SIP, a non-memory device and a memory device need to be directly connected. However, a direct connection may not be possible if the non-memory device and the memory device have pads in different locations from each other or if the designs of devices have been modified. Therefore, a semiconductor package that allows such an interconnection, regardless of device type or design, would be advantageous.

SUMMARY

Example embodiments relate to semiconductor packages and methods of forming the same. A semiconductor package according to example embodiments may include a printed circuit board (PCB). A first semiconductor chip may be mounted on the PCB. A chip package may be mounted on the first semiconductor chip. The chip package may be in direct contact with the first semiconductor chip.

Another semiconductor package according to example embodiments may include a printed circuit board (PCB); a first semiconductor chip mounted on the PCB; an interposer in direct contact with the first semiconductor chip; a semiconductor chip group mounted on the interposer; an encapsulation layer covering the interposer and the semiconductor chip group; and/or a molding layer covering the encapsulation layer, the first semiconductor chip, and the PCB, wherein the interposer electrically connects the first semiconductor chip to the semiconductor chip group.

A method of forming a semiconductor package according to example embodiments may include mounting a first semiconductor chip on a printed circuit board (PCB). A chip package may be prepared and mounted on the first semiconductor chip. The chip package may be mounted so as to be in direct contact with the first semiconductor chip.

DETAILED DESCRIPTION OF EXAMPLE EMBODIMENTS

It will be understood that when an element or layer is referred to as being "on", "connected to", "coupled to", or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component region, layer, or section from another element, component, region, layer, or section. Thus, a first element, component, region, layer, or section discussed below could be termed a second element, component, region, layer, or section without departing from the teachings of example embodiments.

Spatially relative-terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Example embodiments will be described in further detail below with reference to the accompanying drawings. Example embodiments, however, may be embodied in many different forms and should not be construed as limited to the examples set forth herein. In the drawings, the thicknesses of layers and/or regions may have been exaggerated for clarity.

Figure 1A:
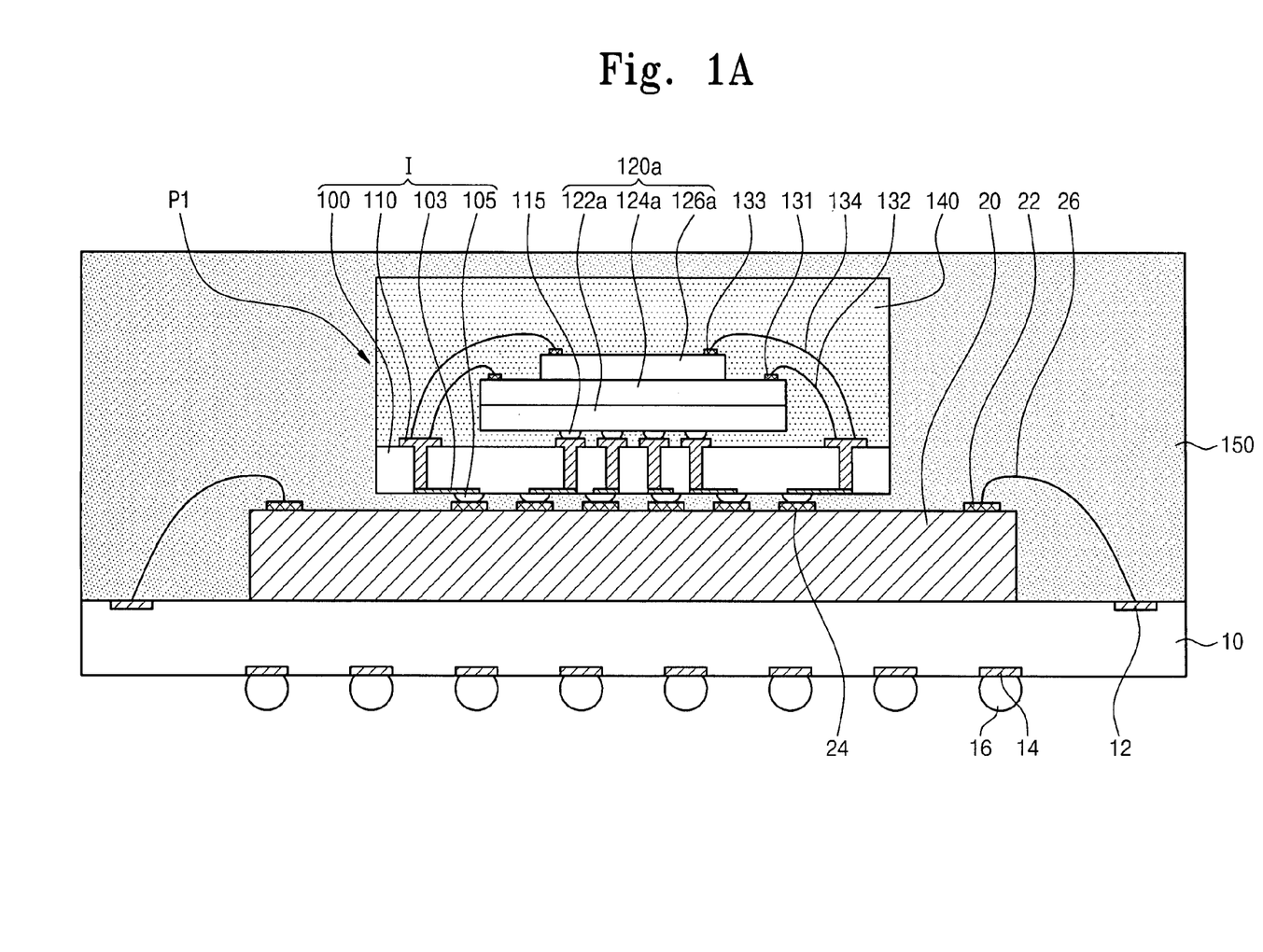
FIG. 1A is a cross-sectional view of a semiconductor package according to example embodiments.

FIG. 1A is a cross-sectional view of a semiconductor package according to example embodiments. Referring to FIG. 1A, the semiconductor package may include a printed circuit board (PCB) 10, a first semiconductor chip 20 and a chip package P1. Lower substrate patterns 14 may be disposed on a lower surface of the PCB 10. Solder balls 16 may be adhered to the lower substrate patterns 14. The solder balls 16 may electrically connect the PCB 10 to an external circuit. Upper substrate patterns 12 may be disposed on an upper surface of the PCB 10.

The first semiconductor chip 20 may be disposed on the PCB 10. An adhesive layer (not shown) may be interposed between the first semiconductor chip 20 and the PCB 10. The first semiconductor chip 20 may be a non-memory device (e.g., logic device). The first semiconductor chip 20 may include first bonding pads 22 disposed near the edge of the upper surface of the first semiconductor chip 20. The first bonding pads 22 may be electrically connected to the upper substrate patterns 12 by first wires 26. First bump pads 24 may be disposed on the upper surface of the first semiconductor chip 20. The first bump pads 24 may be disposed near the center of the upper surface of the first semiconductor chip 20.

The chip package P1 may be directly connected to the first semiconductor chip 20. The chip package P1 may include an interposer I, a semiconductor chip group 120a, and an encapsulation layer 140. The interposer I may electrically connect the first semiconductor chip 20 and the semiconductor chip group 120a. The interposer I may include a semiconductor substrate 100 having through-hole vias 110, redistribution patterns 103 connected to the through-hole vias 110, and first bumps 105 connected to the redistribution patterns 103. The redistribution patterns 103 may be disposed on an insulation layer (not shown) on a lower surface of the semiconductor substrate 100. The first bumps 105 may be disposed on the lower surface of the semiconductor substrate 100 so as to be connected to the redistribution patterns 103 and the first bump pads 24 on the first semiconductor chip 20.

The semiconductor chip group 120a may be disposed on the interposer I. The semiconductor chip group 120a may include a flip chip 122a as a second semiconductor chip, a third semiconductor chip 124a, and a fourth semiconductor chip 126a. Second bumps 115 may be provided on the lower surface of the flip chip 122a. The second bumps 115 may be connected to the through-hole vias 110. The flip chip 122a, the third semiconductor chip 124a, and the fourth semiconductor chip 126a may be memory devices. Adhesive layers (not shown) may be interposed between the flip chip 122a and the third semiconductor chip 124a and between the third semiconductor chip 124a and the fourth semiconductor chip 126a.

The third semiconductor chip 124a and the fourth semiconductor chip 126a may be electrically connected to the through-hole vias 110 by second wires 132 and third wires 134, respectively. The encapsulation layer 140 may be provided so as to cover the semiconductor chip group 120a and the interposer I. The encapsulation layer 140 may include an epoxy molding compound (EMC). A molding layer 150 may be provided so as to cover the encapsulation layer 140, the first semiconductor chip 20, and the PCB 10. The molding layer 150 may be formed of the same material as the encapsulation layer 140. Alternatively, the molding layer 150 may be formed of a different material from the encapsulation layer 140.

According to example embodiments, the chip package P1 may be directly connected to the first semiconductor chip 20. Even when the locations of the bumps and pads of the semiconductor chip group 120a and the first semiconductor chip 20 have been modified, the semiconductor chip group 120a and the first semiconductor chip 20 may still be connected to each other by means of the interposer I. Thus, a semiconductor package capable of relatively high-speed operation may be realized, regardless of whether design modifications may be needed in connection with the logic device and/or memory device.

Figure 1B:
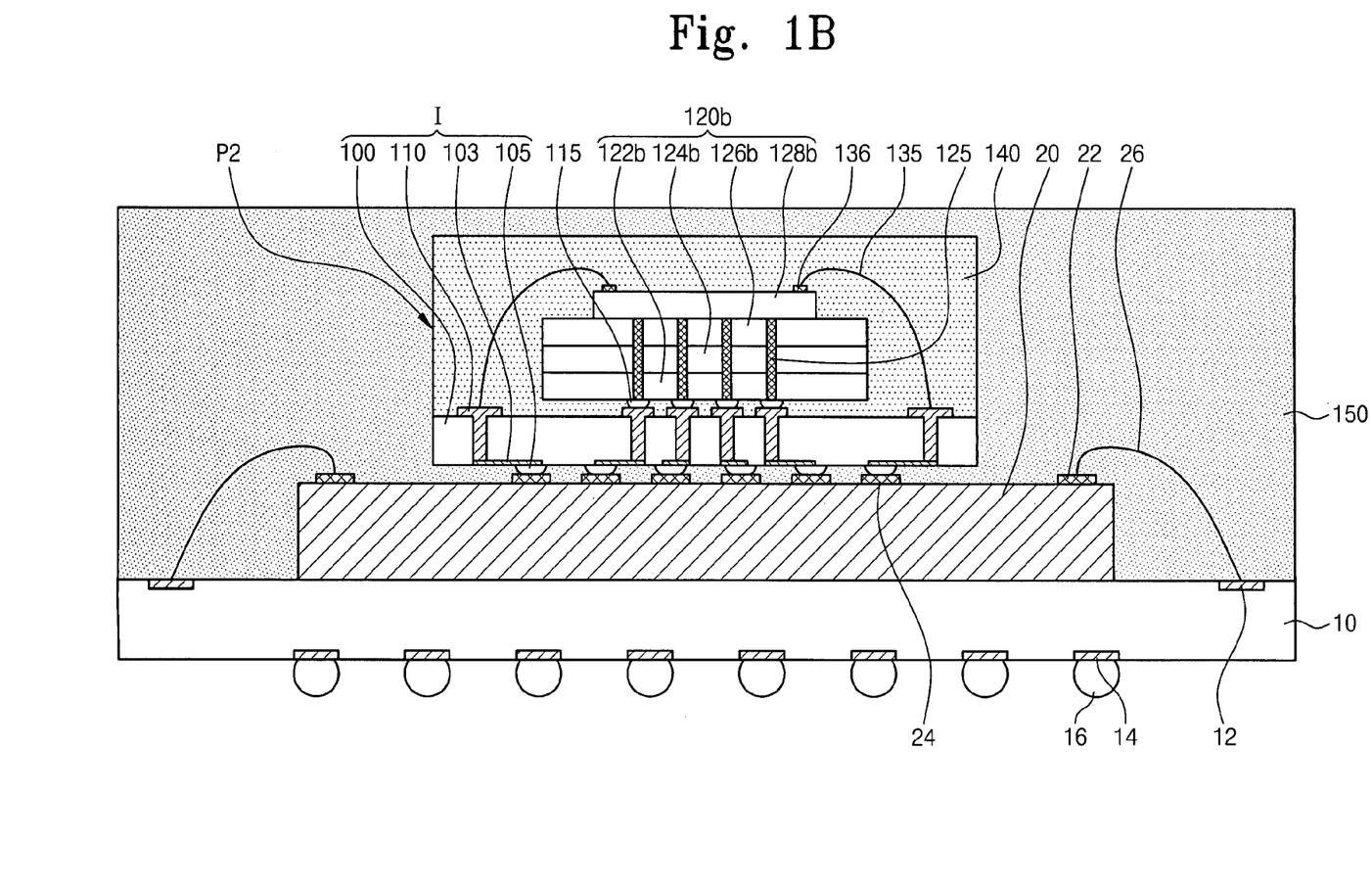
FIG. 1B is a cross-sectional view of another semiconductor package according to example embodiments.

FIG. 1B is a cross-sectional view of another semiconductor package according to example embodiments. It should be understood that the description of common features already discussed above will be omitted for brevity, while any new or different features will be described in further detail below. Referring to FIG. 1B, a semiconductor package according to example embodiments may include a printed circuit board (PCB) 10, a first semiconductor chip 20, and a chip package P2. The PCB 10 may include upper substrate patterns 12, lower substrate patterns 14, and solder balls 16. The first semiconductor chip 20 may include first bonding pads 22 and first bump pads 24 on the upper surface of the first semiconductor chip 20. First wires 26 may be provided to electrically connect the first bonding pads 22 and the upper substrate patterns 12.

The chip package P2 may be directly connected to the first semiconductor chip 20. The chip package P2 may include an interposer I, a semiconductor chip group 120b, and an encapsulation layer 140. The interposer I may include a semiconductor substrate 100 having through-hole vias 110, redistribution patterns 103 disposed on the lower surface of the semiconductor substrate 100, and first bumps 105 connected to the redistribution patterns 103.

The semiconductor chip group 120b may include a second semiconductor chip 122b, a third semiconductor chip 124b, a fourth semiconductor chip 126b, and a fifth semiconductor chip 128b. The second, third, and fourth semiconductor chips 122b, 124b, and 126b, respectively, may be electrically connected to each other by penetration interconnections 125. The penetration interconnections 125 may contact second bumps 115. The fifth semiconductor chip 128b may include second bonding pads 136 on its upper surface. The second bonding pads 136 may be electrically connected to the through-hole vias 110 by means of second wires 135.

It should be understood that the chip packages P1 and P2 of FIG. 1 and FIG. 2, respectively, may be embodied in various forms and may include additional semiconductor chips. It should also be understood that the various shapes and forms of the semiconductor chip groups 120a and 120b are only examples and should not to be construed to limit example embodiments of the present application.

Figure 2:
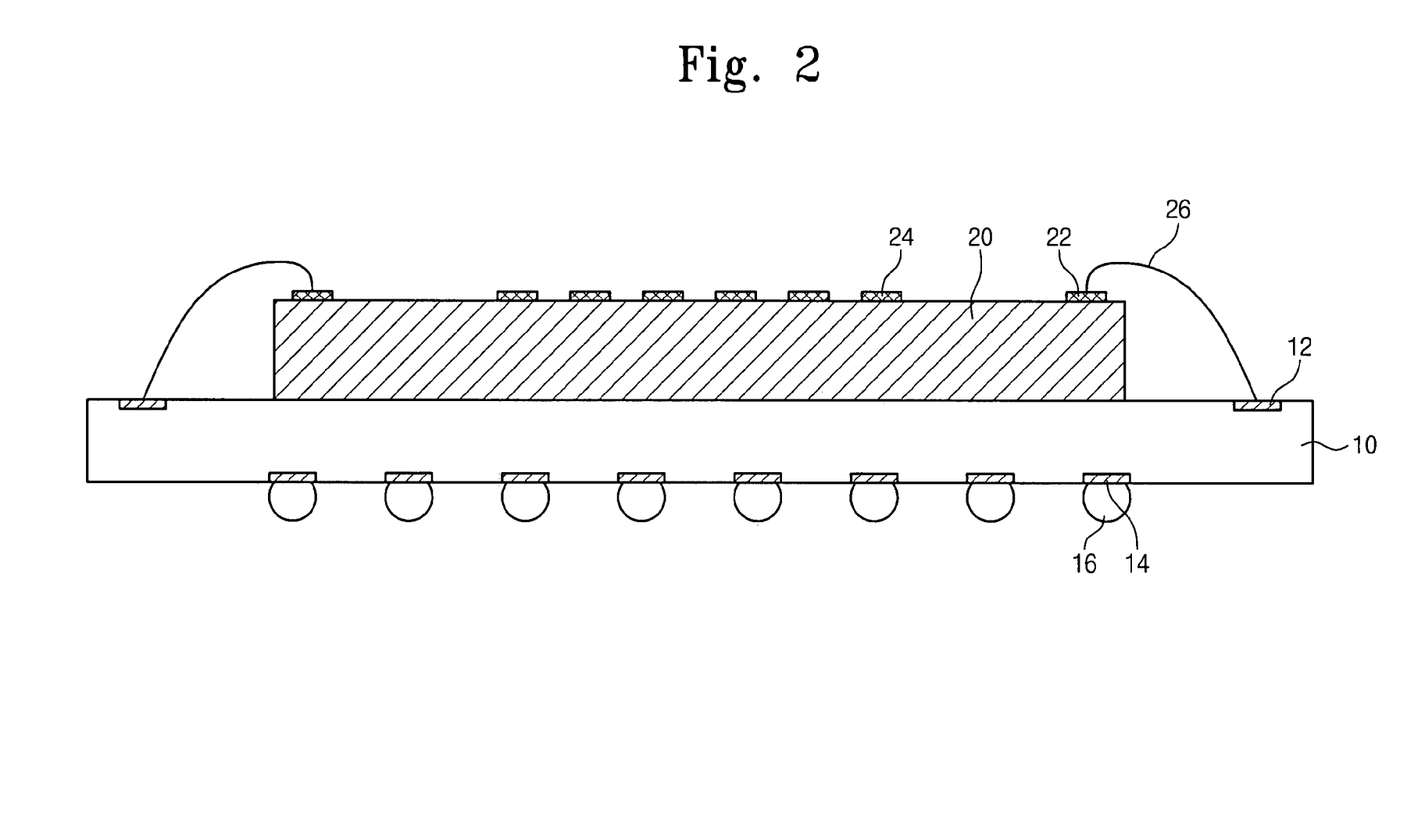
FIG. 2 and FIGS. 3A to 3D are cross-sectional views of a method of forming a semiconductor package according to example embodiments.

FIG. 2 and FIGS. 3A to 3D are cross-sectional views of a method of forming a semiconductor package according to example embodiments. Referring to FIG. 2, a first semiconductor chip 20 may be mounted on a printed circuit board (PCB) 10. The PCB 10 may include upper substrate patterns 12 on its upper surface and lower substrate patterns 14 on its lower surface. Solder balls 16 may be bonded to the lower substrate patterns 14 to provide a connection to an external circuit. The first semiconductor chip 20 may include first bonding pads 22 near the edges of its upper surface. First wires 26 may connect the first bonding pads 22 and the upper substrate patterns 12. First bump pads 24 may be formed near the center of the upper surface of the first semiconductor chip 20.

Figure 3A:
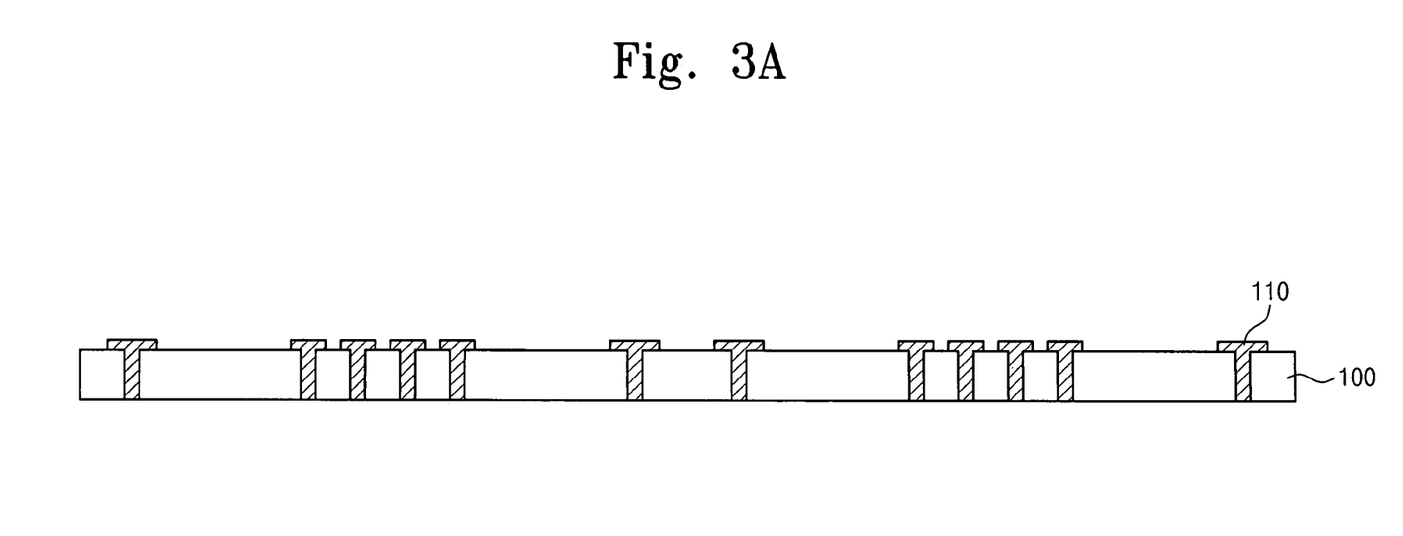

Referring to FIG. 3A, through-hole vias 110 may be formed in a semiconductor substrate 100. Forming the through-hole vias 110 may include creating via holes in the semiconductor substrate 100 with a laser drill and filling the via holes with a conductive metal. The via holes may be filled with a conductive metal using an electroplating method.

Figure 3B:
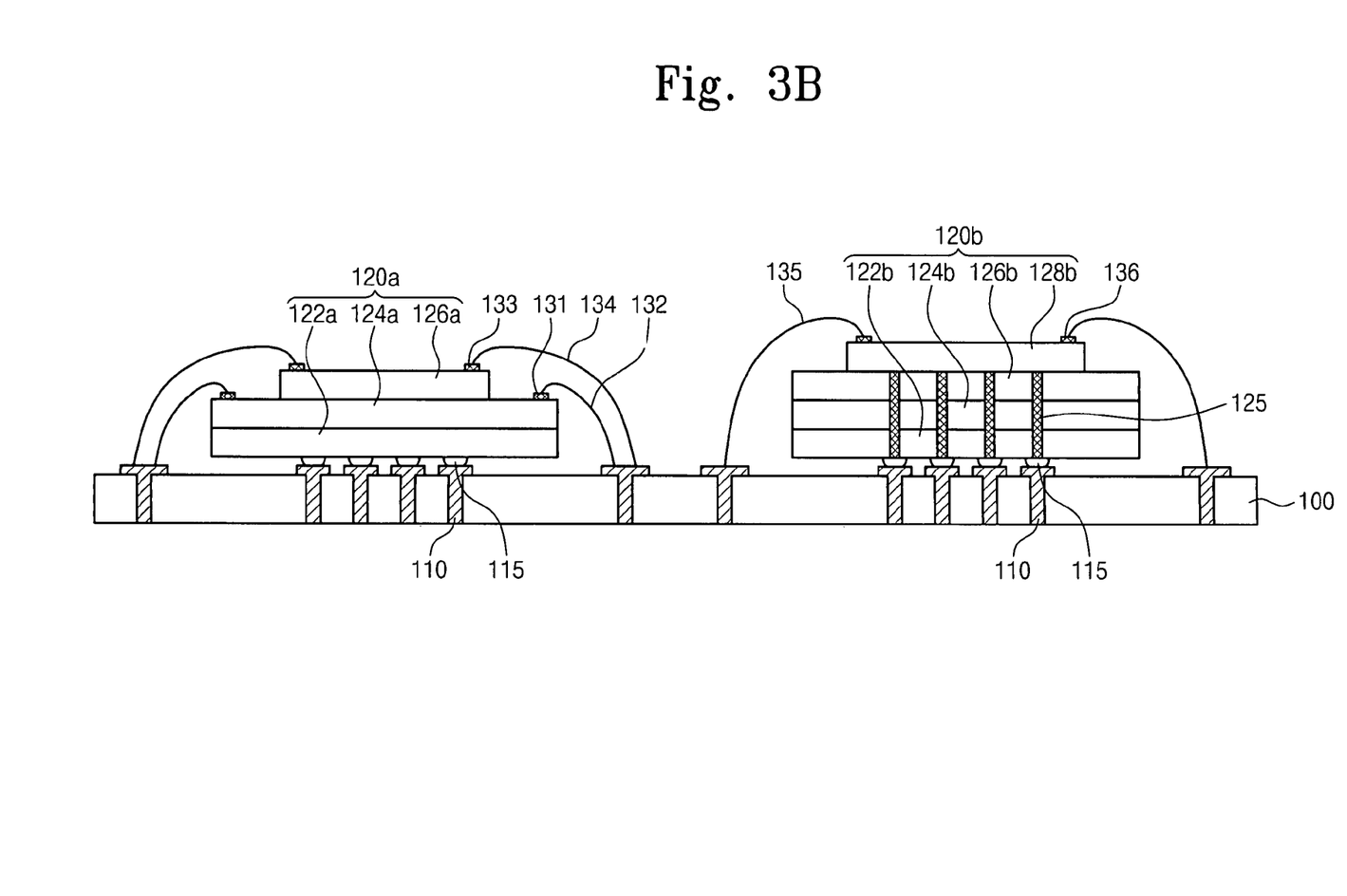

Referring to FIG. 3B, first and second semiconductor chip groups 120a and 120b may be mounted on the semiconductor substrate 100. The first semiconductor chip group 120a may include a flip chip 122a as a second semiconductor chip, a third semiconductor chip 124a, and a fourth semiconductor chip 126a. The flip chip 122a may have second bumps 115 on its lower surface. The second bumps 115 may be connected to the through-hole vias 110. The third semiconductor chip 124a and the fourth semiconductor chip 126a may include second bonding pads 131 and third bonding pads 133, respectively. Second wires 132 may connect the second bonding pads 131 and the through-hole vias 110. Third wires 134 may connect the third bonding pads 133 and the through-hole vias 110.

The second semiconductor chip group 120b may include a second semiconductor chip 122b, a third semiconductor chip 124b, a fourth semiconductor chip 126b, and a fifth semiconductor chip 128b. The second, third, and fourth semiconductor chips 122b, 124b, and 126b may be electrically connected by penetration interconnections 125. Second bumps 115 may be formed on the lower surface of the second semiconductor chip 122b so as to contact the penetration interconnections 125. The second bumps 115 may connect the through-hole vias 110 in a flip chip manner. The fifth semiconductor chip 128b may include second bonding pads 136. Second wires 135 may electrically connect the second bonding pads 136 and the through-hole vias 110. Although one form of the first and second semiconductor chip groups 120a and 120b are discussed above, it should be understood that other variations are also possible.

Figure 3C:
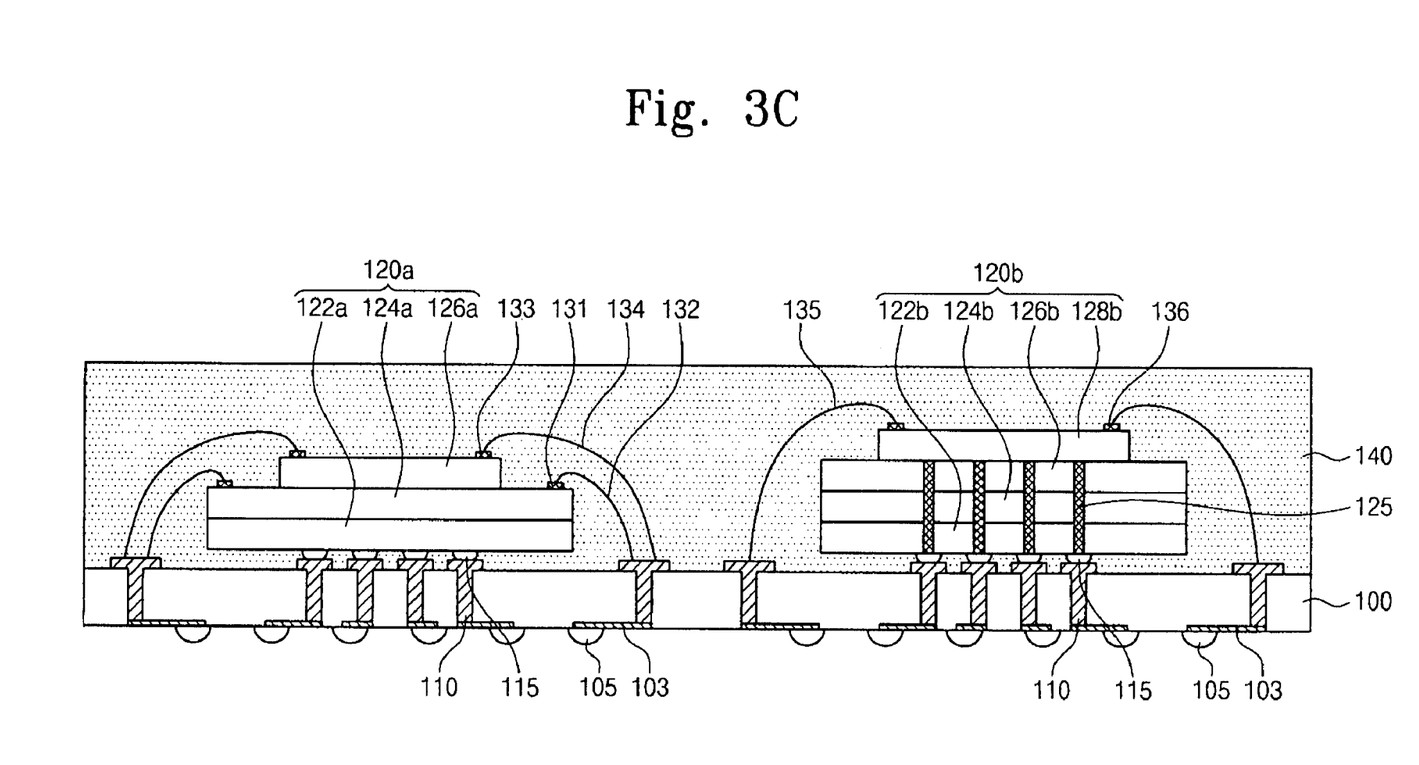

Referring to FIG. 3C, an encapsulation layer 140 may be formed so as to cover the upper surfaces of the first semiconductor chip group 120a, the second semiconductor chip group 120b, and the semiconductor substrate 100. The encapsulation layer 140 may be formed of an epoxy molding compound (EMC). The lower surface of the semiconductor substrate 100 may be etched to reduce the thickness of the semiconductor substrate 100. Etching the lower surface of the semiconductor substrate 100 may include performing a mechanical polishing process followed by a wet etch process. The etching time may be reduced by performing the mechanical polishing process first.

Redistribution patterns 103 may be formed on the lower surface of the semiconductor substrate 100 so as to contact the through-hole vias 110. First bumps 105 may be formed on the lower surface of the semiconductor substrate 100 so as to contact the redistribution patterns 103. Accordingly, an interposer I may include the semiconductor substrate 100, the through-hole vias 110, the redistribution patterns 103, and the first bumps 105.

Figure 3D:
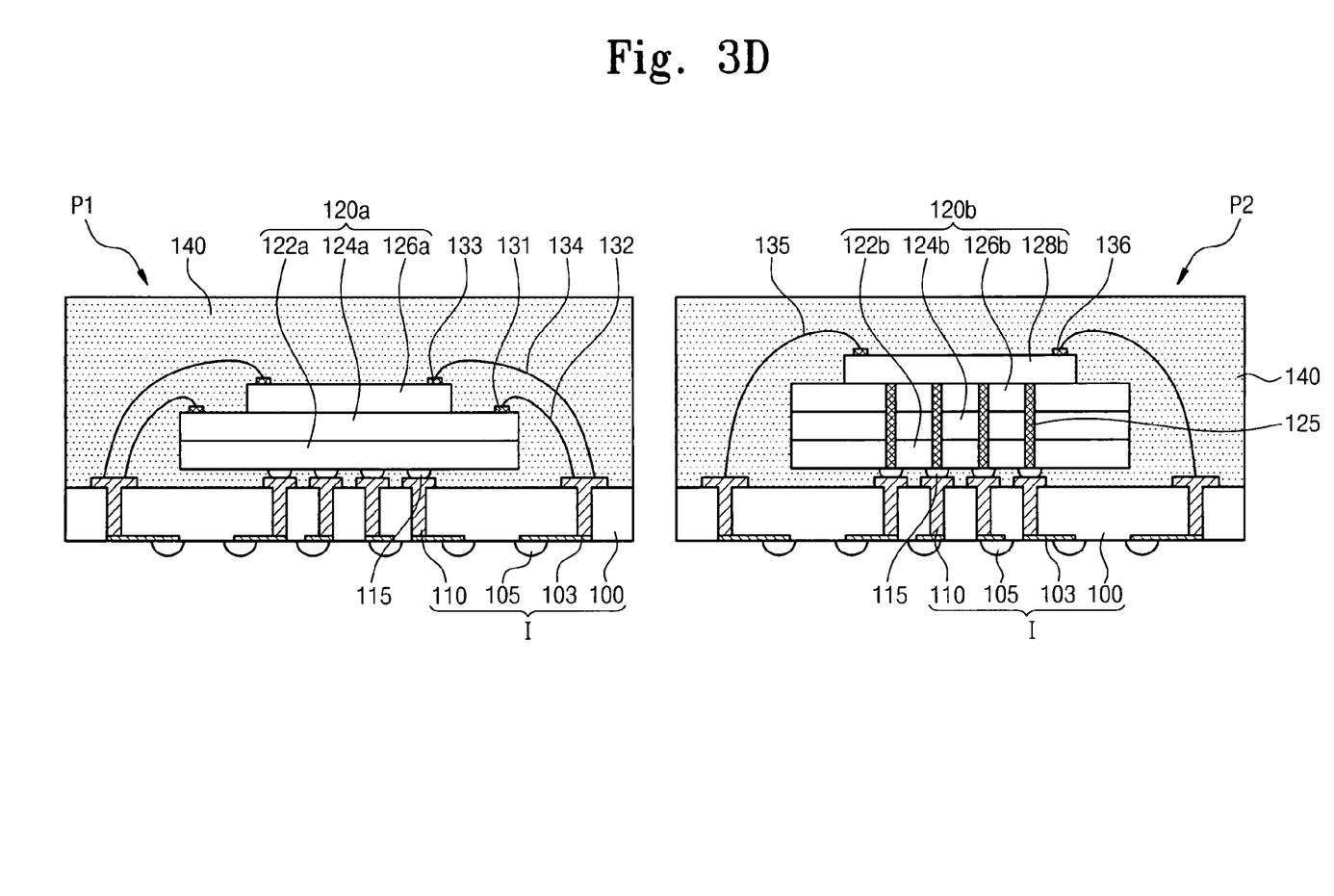

Referring to FIG. 3D, the semiconductor substrate 100 may be cut to separate the first and second semiconductor chip groups 120a and 120b, thus generating a first chip package P1 and a second chip package P2. Before cutting the semiconductor substrate 100, a wafer level test may be performed to identify devices of relatively high quality.

The first chip package P1 may be mounted on a first semiconductor chip 20 (e.g., FIG. 1A). Alternatively, the second chip package P2 may be mounted on a first semiconductor chip 20 (e.g., FIG. 1B). Mounting the first chip package P1 or the second chip package P2 on the first semiconductor chip 20 may include joining the first bumps 105 to the first bump pads 24. A molding layer (not shown) may be formed so as to cover the first chip package P1, the first semiconductor chip 20, and the PCB 10 so as to achieve the semiconductor package of FIG. 1A. Alternatively, a molding layer (not shown) may be formed so as to cover the second chip package P2, the first semiconductor chip 20, and the PCB 10 so as to achieve the semiconductor package of FIG. 1B. The molding layer may be formed of EMC.

According to example embodiments, a chip package may be directly mounted on a semiconductor chip. Even when the locations of the pads and the bumps of a logic device and a memory device are modified, an electrical connection may still be achieved by means of an interposer. Consequently, a semiconductor package capable of relatively high-speed operation may be realized, regardless of whether design modifications may need to be made in connection with a logic device and a memory device.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A semiconductor package comprising:
   a printed circuit board;
   a first semiconductor chip on the printed circuit board; and
   a chip package on the first semiconductor chip, the chip package including an interposer and a semiconductor chip group on the interposer, the interposer electrically connecting the semiconductor chip group to the first semiconductor chip,
   wherein a first conductive terminal is disposed on an upper surface of the first semiconductor chip, a second conductive terminal is disposed on a lower surface of the interposer, and the first conductive terminal is also disposed on the second conductive terminal.

2. The semiconductor package of claim 1, wherein the interposer includes a semiconductor substrate having through-hole vias.

3. The semiconductor package of claim 2, wherein
   the first conductive terminal includes first bump pads on an upper surface of the first semiconductor chip; and the second conductive terminal includes first bumps on a lower surface of the interposer, the first bumps electrically connected to the through-hole vias and the first bump pads.

4. The semiconductor package of claim 1, wherein the semiconductor chip group includes:
   a second semiconductor chip having bumps connected to the through-hole vias, the second semiconductor chip being disposed on the interposer as a flip chip; and
   a third semiconductor chip on the second semiconductor chip, the third semiconductor chip having bonding pads.

5. The semiconductor package of claim 4, further comprising:
   bonding wires electrically connecting the bonding pads and the through-hole vias.

6. The semiconductor package of claim 4, further comprising:
   an encapsulation layer covering the third semiconductor chip, the second semiconductor chip, and the interposer; and
   a molding layer covering the encapsulation layer, the first semiconductor chip, and the printed circuit board.

7. The semiconductor package of claim 1, wherein the first semiconductor chip includes a non-memory device, and the semiconductor chip group includes memory devices.

8. The semiconductor package of claim 1, further comprising:
   solder balls on a lower surface of the printed circuit board.

9. The semiconductor package of claim 1, further comprising:
   penetration interconnections within the semiconductor chip group, wherein the semiconductor chip group includes a plurality of semiconductor chips, the penetration interconnections extending through and electrically connecting the plurality of semiconductor chips.

10. The semiconductor package of claim 1, wherein the chip package includes at least one semiconductor chip with a penetration interconnection extending completely through the at least one semiconductor chip.

11. The semiconductor package of claim 10, wherein the at least one semiconductor chip with the penetration interconnection is not connected to a bonding wire.

12. The semiconductor package of claim 10, wherein the at least one semiconductor chip with the penetration interconnection is not an uppermost semiconductor chip in the chip package.

13. The semiconductor package of claim 1, wherein the chip package includes a plurality of semiconductor chips, each of the plurality of semiconductor chips having a penetration interconnection that is aligned with a penetration interconnection of an adjacent semiconductor chip.

14. The semiconductor package of claim 1, wherein the chip package includes a plurality of directly stacked semiconductor chips.

15. The semiconductor package of claim 1, wherein the chip package includes a plurality of semiconductor chips that are stacked so as not be spaced apart from each other.

16. The semiconductor package of claim 1, wherein the chip package includes a plurality of semiconductor chips, and only an uppermost semiconductor chip of the plurality of semiconductor chips is connected to a bonding wire.

17. The semiconductor package of claim 2, wherein the semiconductor chip group includes bumps disposed on its bottom face, each of the bumps of the semiconductor chip group being aligned with each through-hole via of the interposer.

18. The semiconductor package of claim 2, wherein the chip package includes at least one semiconductor chip with penetration interconnections that are aligned with each of the through-hole vias of the interposer.

19. The semiconductor package of claim 1, wherein a semiconductor chip of the semiconductor chip group that is closest to the interposer is not connected to a bonding wire.

* * * * *